United States Patent [19]

Tims et al.

[11] Patent Number: 5,748,870
[45] Date of Patent: May 5, 1998

[54] FAULT-TOLERANT NETWORKABLE COMPUTER SOFTWARE WITH ACCESS LOCKING

[75] Inventors: Fred William Tims, Springfield Center; Richard F. Clowes, New York; Kevin C. Yager, Oneida; David J. Schroeder, New Hartford, all of N.Y.

[73] Assignee: Non-Stop Networks Limited, New York, N.Y.

[21] Appl. No.: 44,323

[22] Filed: Apr. 7, 1993

Related U.S. Application Data

[63] Continuation-in-part of Ser. No. 610,181, Nov. 7, 1990.

[51] Int. Cl.$^6$ .................................................. G06F 11/00
[52] U.S. Cl. ................................................... 395/182.02
[58] Field of Search ...................... 395/182.02, 182.04, 395/182.08, 183.1

[56] References Cited

U.S. PATENT DOCUMENTS 5,436,909   7/1995   Dev et al. ........................ 395/182.02

Primary Examiner—Vincent P. Canney
Attorney, Agent, or Firm—Handal & Morofsky

[57] ABSTRACT

The invention relates to the provision of software with fault tolerant capabilities enabling computer networks to survive or tolerate most individual failures, short of system wide catastrophes such as earthquakes, without loss of data and without loss of access to working data.

6 Claims, 1 Drawing Sheet

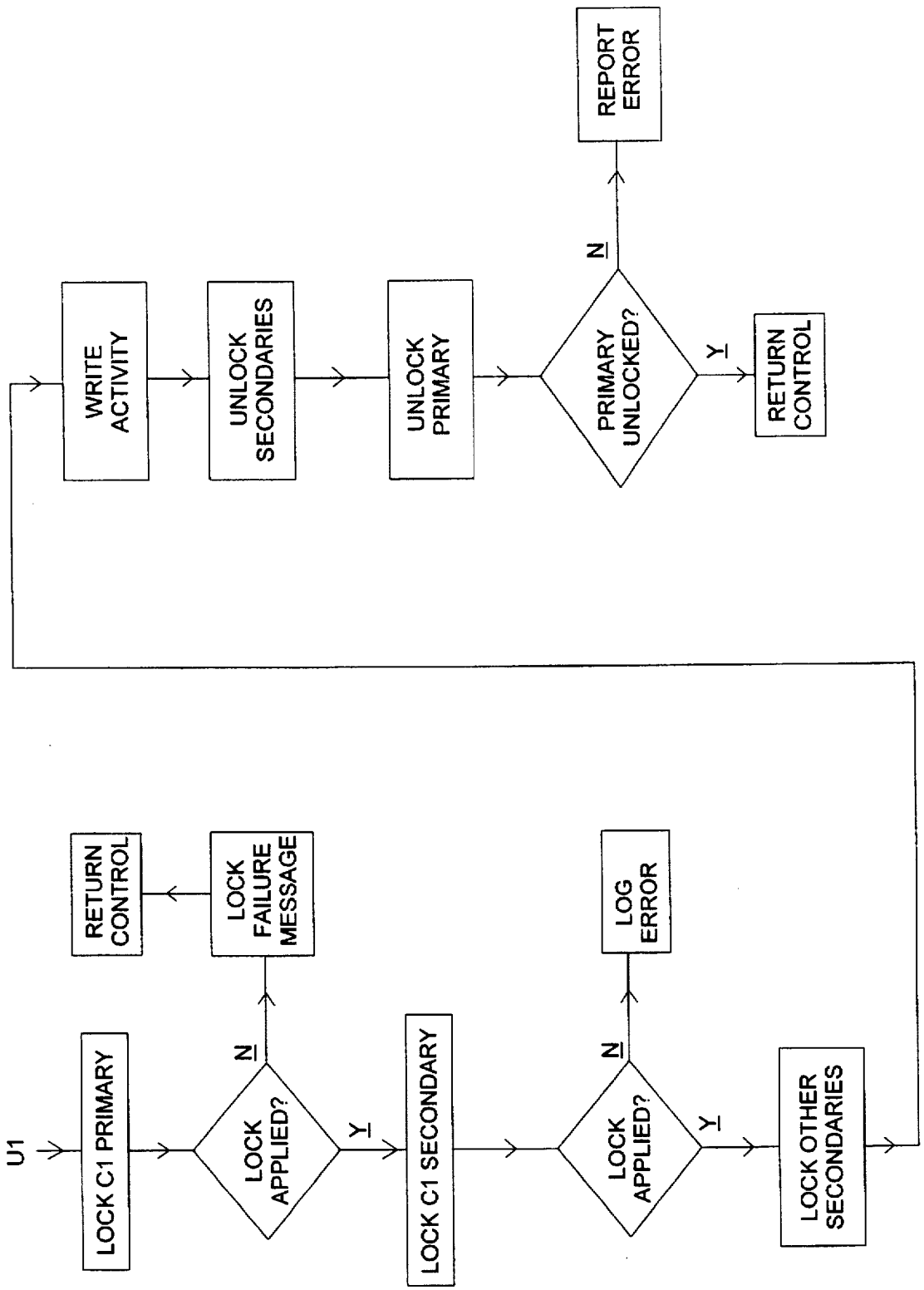

FAULT-TOLERANT NETWORKABLE COMPUTER SOFTWARE WITH ACCESS LOCKING

CROSS-REFERENCE TO A RELATED APPLICATION

This application is a continuation-in-part of application Ser. No. 07/610,181 filed Nov. 7, 1990, the disclosure of which is herein incorporated by reference thereto.

TECHNICAL BACKGROUND

This invention relates to fault-tolerant computer software for computer networks. Networks usually consist of groups of intelligent workstations, or terminals, each of which can process data locally. The members of a group are connected together to share a resource, for example a data storage device, or logical drive. Typically, network activity is organized by a network operating system having a network shell loaded to RAM at each workstation.

An important embodiment of such networks is a client-server network wherein a number of the intelligent workstations are connected as clients of a server providing services such as data storage and communication. File servers are often centralized repositories of vast libraries of data and application software. An alternative network configuration is known as peer-to-peer. This configuration enables individual workstations to use each other's resources without requiring a server.

BACKGROUND OF THE INVENTION

More particularly, the invention relates to the provision of software with fault-tolerance capabilities enabling such computer networks to survive, or tolerate, most, or all, individual hardware failures, (short of system-wide catastrophes such as earthquakes) without loss of data, and without loss of access to working data.

Basic fault tolerance can be as simple as backing-up data from a hard drive to a diskette, or the use of an uninterruptible power supply to provide temporary insurance against loss of power. Advanced levels of fault tolerance enable users to survive failure of a file server, or local processor without loss of data. Advanced fault-tolerant systems have, until recently, been the province of the mainframe and minicomputer environment. Such expensive environments often employ equipment laden with redundant processors and the like, providing substantial fault tolerance, albeit at a price.

Another relevant limitation of the mainframe and minicomputer environment, is that such redundant systems are usually found in a single box, or at a single physical location, which is vulnerable to local disasters such as fire, or may have all their redundant components simultaneously put out of service by sprinkler system operation.

More than twelve months prior to the date of this application, Nonstop Networks Limited, assignees of the present invention, has distributed a product manufactured in accordance with the teaching of the invention disclosed in their UK Patent Application GB 2,251,502 A "GB '502", hereinafter published on Jul. 8, 1992, a date less than twelve months prior to the date of the present application.

GB '502 (the disclosure of which is incorporated herein by reference thereto), describes a powerful, flexible, yet efficient and economic software system that can provide what is known as level-three fault tolerance, for networked personal computers, including, in preferred embodiments, DOS-supporting personal computer workstations. GB 2,251,502 A discloses an on-line, data-replication software system loadable into RAM at a workstation, where the system runs in background, unaffected by the loading and unloading of applications, and replicates data to two or more target storage devices, or logical drives. Faithful replication of data to multiple drives is sometimes called "mirroring". The data-replication software of GB 2,251,502 A is capable of maintaining an exact, functionally accurate, duplicate, data image on a secondary drive.

GB 2,251,502 A also offers the possibility of continuous processing. Expressed on a network, this is the ability automatically to switch processing from a failed server to a backup server, in a manner that is transparent to users. While the data-replication software of GB 2,251,502 A provides these capabilities in a reliable and efficient manner, with preservation of data integrity, and with a smooth switchover from a failed server to a backup server, some difficulty may occur in maintaining configurations of data traffic management protocols. Because of the heterogeneity of a modern computer network, the best of protocols may develop anomalies that lead to environmental inconsistencies which, although not affecting data integrity and usability, may inconvenience network users, especially in the case of data accessed by multiple users.

A data replication product used for fault tolerance is, for the purchaser, a form of insurance which has a cost and imposes a system overhead. To justify its existence, such a fault-tolerant data-replication software product must be extremely accurate, generating replicated data images that have great integrity. Additionally, because the information protected by replication may have a value of millions of dollars, or much higher, great confidence is demanded in the accuracy and integrity of the data.

Unusually high performance standards are thus a prerequisite for the commercial success of fault-tolerant software. The software must be proof not only against the practical day-to-day hazards of a normal operating environment, but also against improbable events. For example, loss of synchronization between mirrored drives is an undesirable condition which, at best, engenders uncertainty, but more probably, imperils data integrity. Such loss of synchronization is more likely to be attributable to the condition of the data-storage environment than to discrepancies between the data images themselves. However, if it endures, loss of synchronization may lead to data discrepancies that are fatal to confidence.

One source of problems may be timing differences arising from the physical constraints of distance and the speed of travel of data packets on the network, (which is near the speed of light). Thus workstations replicating data writes across the network will usually be at different distances from their target primary and secondary drives. Some distances can be quite substantial, so that it becomes theoretically possible that secondary writes could arrive at a secondary drive with a phase change due to distance differentials which put the secondary writes out of sequence with primary ones. Network operating systems and applications usually include data-access control protocols to manage access to a primary server. The prior art is silent as to how these protocols should be treated on the secondary.

SUMMARY OF THE INVENTION

The present invention solves problems relating to network-traffic anomalies that may occur in the maintenance of replicated data images on a computer network, using on-line, data-replication software.

An objective of the invention is to provide data-replication software which overcomes problems of potential desynchronization of mirrored logical drives. Another objective of the invention is to provide means to maintain a coherent access-lock protocol for a secondary logical drive or storage device, on a computer network equipped with multiple servers and with continuous processing means, to facilitate transfer of processing to a secondary or backup file server after failure of a primary server. A further objective is to improve management of complex network operating system protocols insofar as they relate to on-line data replication.

While the data-replication software disclosed in GB 2,251,502A is successful and effective, one problem that arises is the need to adapt the data-replication software to a variety of network operating systems. In some cases, this may entail a substantial amount of code. RAM being valuable, it is desirable to minimize the size of the data-replication software.

Another aspect of the invention solves this problem by incorporating data-replication software in a network operating system as a functioning module integrated into a network shell loadable to each workstation's RAM. Preferably, the data-replication software cannot be separated from the network shell, for copying, loading or the like. A difficulty in this approach is that independence of the data-replication software from the network operating system and the ability to be retrofitted to existing networks, without changing the operating system are sacrificed.

BRIEF DESCRIPTION OF THE DRAWING

The single figure of the drawing is a block flow diagram of one embodiment of an access-lock sequencing protocol for data-replication software according to the invention, implemented on a computer network.

DETAILED DESCRIPTION OF THE PREFERRED EMBODIMENTS

This invention provides improvements in on-line, data-replication software operative on a computer network having multiple, intelligent processor-equipped workstations, which software is loadable to RAM at said work-stations. The inventive data-replication software replicates data-changing activity originating from said workstation to both a primary storage device supported by a primary file server and to a secondary storage device, for example, as described in GB '502. The primary file server provides multi-user access to said primary storage device and supports data-access locking with data-access lock and unlock capabilities for regulating multi-user access to data on the primary logical drive. The foregoing features are known from GB '502 and describe the environment of the present invention.

More particularly stated, the invention provides, in said data-replication software, an access-lock-sequencing protocol comprising:

a) an access lock sequencer operative to apply access locks sequentially, firstly to data on said primary storage device and subsequently to replicated data, on said secondary storage device; and b) an access-unlock sequencer operative to remove access locks sequentially, firstly, from access-locked data on said secondary storage device and subsequently from access-locked data on said primary storage device.

Preferred embodiments also deny all users access to a secondary while the primary is running, because any direct writes to the secondary, not also made to the primary, would corrupt the data image on the secondary. Such security for the secondary drive is a feature of the data-replication software of GB 2,251,502A.

Attempts to access the secondary directly can be met simply by returning the primary drive label or returning an error message such as "drive not found".

In a preferred embodiment, the secondary storage device is supported by a secondary, or backup, file server which can take over processing in the event of failure of the primary. The data-replication software includes a drive re-labeling routine to transfer processing routed by a workstation from the failed primary to the secondary.

Also, in preferred embodiments, where the system comprises multiple secondary storage devices for additional levels of data redundancy, said access-lock sequencer can apply access locks to each said secondary storage device in turn, in a specified, secondary, lock-applying sequence and said access-unlock sequencer can remove locks from said secondary storage devices in the same sequence. The particular sequence in which multiple secondaries are locked and unlocked is not important so long as all secondaries are locked after the primary is locked and all secondaries are unlocked before the primary is unlocked.

The invention's novel sequencing ensures that a user, upon being redirected to the secondary drive after loss of the primary, will not find a file, record or other data category in an unlocked condition on the secondary drive, which had been in a locked condition on the primary drive.

Among the improbable scenarios that can be envisaged is that of a file server or storage device failing or suffering a critical error at or about or between the application or removal of access locks to or from the primary and one or more secondaries. Such problems are believed effectively handled by critical error handlers such as that described in GB 2,251,502A.

Towards the objective of maintaining data integrity of the highest order, it is desirable to ensure that replicated data copies, or data mirrors, also accurately reflect the locked or unlocked status of all data. Such accurate lock status has particular significance for continuous processing to avoid unregulated changes to files or records, or other data categories.

Preferably, the inventive, on-line, data-replication software includes a careful protocol to handle the eventuality of a failure to execute an instruction to apply a lock to either primary or secondary storage devices so as to ensure users will access data in a properly regulated manner serving the normal purposes of applying locks.

Such a protocol can be incorporated into the operation of a lock-applying error handler. Preferred embodiments include a lock error handler which responds to a lock-applying failure encountered while applying locks, in a specified, predetermined manner designed to avoid data-access-lock inconsistencies.

Lock-applying errors encountered while attempting to APPLY a data access lock to data on a PRIMARY storage device Preferably, such a lock error handler responds to a lock-applying failure encountered in writing to the primary, by returning a lock-applying failure message, or report, to the client or workstation, without attempting to apply, or replicate the lock to the secondary. Such a routine is consistent with a preferred protocol for data replication, as described in GB '502.

To write a lock to a secondary, after a failed attempt to write it to the primary, would create problems of desynchronization as between the (failed) primary and secondary data images, or of uncertainty at the client source as to the fate of the lock write, as it would occur with any other data.

Lock-applying errors encountered while attempting to APPLY a data access lock to data on a SECONDARY storage device Where a lock-applying error is reported at the secondary storage device or devices, when attempting to write or apply a data-access lock, then a transient condition is assumed to have occurred and possibly to have been caused by an improper access procedure, for example, direct access of the secondary by a workstation. Accordingly, the error is ignored, processing continues as if the failure had not occurred, and an error is logged for later inspection by a system administrator. Where the system comprises multiple secondary drives, the data access lock is applied (or attempted) on the other secondary drives.

Lock-applying errors encountered while attempting to REMOVE a data-access lock from a PRIMARY storage device Where a lock-applying error is reported at the primary storage device or devices, when attempting to remove a data-access lock, then a lock-applying failure should be reported back to the client, or workstation, source of the write.

Towards the objective of facilitating continuous processing, the ability to redirect processing to a surviving secondary drive after the loss of a primary, it is desirable that the data-replication software, in addition to replicating writes also track reads and mirror read positioning on the secondary drive, in order to be properly positioned, in the correct data category of a large file, when resuming processing on the secondary.

The invention solves the problem of a failure to apply a lock to a secondary drive after a lock has been applied to a primary. Noting that locks are usually user-specific, that is to say user U1 locks data category C1 for their own write activities to the exclusion of all other users, if a secondary lock is not applied, there is a risk that, after failure of the primary, other users may be able to access and update data category C1. Data files should not be simultaneously updated by multiple users. Updates must be sequential; which is the point of multi-user software, and of data-access locking routines.

The present invention provides an elegant solution to the above problems by removing access locks from any secondary drive prior to the primary. This ensures that when user U1 obtains exclusive use of data category C1 on the primary, the mirror image of data category C1 on the secondary is already locked for the exclusive use of user U1. Thus, if the primary fails, no other user can corrupt data category C1 on the secondary.

The foregoing procedure whereby a user U1 locks a data category C1 on a primary server, then a secondary server, and conducts unlocking in the reverse sequence, together with system responses to errors encountered, is illustrated in the single figure of the drawing.

Typically, the software supporting a storage device includes a lock table to track lock activity on that device. Being of limited capacity, the lock table can become filled so that no more locks can be applied. Should the primary drive lock table become filled, no problems arise, because the request for an access lock is refused or returned as an error, with no attempt being made to apply the lock to a secondary. Accordingly, no lock mismatch arises.

The present invention is particularly advantageous when used with heterogenous primary and secondary drives that are not perfectly matched. One example is where other activities are conducted on the secondary drive, and the secondary drive is used for the storage of external multiuser data as well as specified data. Another is where a different operating system supports the secondary drive, as might be the case, for example where the secondary is a backup file server supported by an older version or different brand of network operating software.

In another aspect, the invention provides a computer network operating system for a computer network having multiple, intelligent, data-manipulating workstations interconnected on said network for resource sharing, a primary logical drive and a secondary logical drive, said logical drives being accessible by said workstations for data transfer therebetween, said network operating system comprising a network shell loadable to each said intelligent workstation to provide said resource sharing, said network shell including a data-replication module to provide fault tolerance by continuously maintaining a functionally identical, duplicate data image on said secondary logical drive of data on said primary logical drive, said data-replication module comprising data-replication means to replicate all data-changing activity generated at each said workstation and addressed to said primary logical drive, to said secondary logical drive wherein, in operation, said network shell is loaded to, and operative at, each said workstation having data-changing access to said primary logical drive, whereby all individual data changes of said primary logical drive data effected at said workstations are replicated to said secondary logical drive thereby to maintain a functionally identical duplicate data image on said secondary logical drive of said primary logical drive data, in a continuous manner.

This aspect of the invention enables the practice of a particularly advantageous embodiment in which the network operating system comprises means to couple access rights to said primary logical drive with said data-replication module whereby all workstations accessing said primary logical drive also replicate data to said secondary logical drive.

Another problem solved by the present invention is that of ensuring that all data changes to a primary logical drive that are made by any of a plurality of users on a network are replicated to a secondary logical drive to maintain a functionally identical data image on a secondary drive.

In GB '502 this problem is solved by means of a setup routine which specifies drive pairs for mirroring and is loadable to each workstation, preferably by way of a line or two in AUTOEXEC.BAT (for DOS embodiments). While effective, this solution has the drawback that poor network administration can permit a user to log on to the primary without mirroring to a secondary.

The present invention solves this problem by including mirroring as a required routine in the network shell activated by the user log-in script. Thus, as each user signs on to the network or, as each user is given access to a drive specified for mirroring, a data-replication software module is loaded to, or activated in workstation RAM within the shell. Additional features can give a network administrator the option of specifying pairs, or groups of drives for mirroring with such specification and data replication software automatically being activated when a user is given access to a specified primary drive. Access to secondaries is denied to all users optionally with the exception of a network administrator, while the relevant primary or primaries is giving a good return.

Problems in providing on-line data replication software in the network shell are that the programmer needs access to network operating system source code which, for recognized operating system products is extremely difficult to obtain;

that the resultant data replication software product is not marketable as an accessory for installation on existing networks (a new NOS must be installed) and possible side-effects within the complex routines of the NOS are unknown.

Network users, their resources and file server or file servers are usually connected together by a single cable that visits each user or resource or file server in turn, each tapping off the cable at a node, and each being parallel-connected to the cable. Some networks are open-ended with terminations. Others for example, TOKEN RING (trademark IBM Corp.), are closed loop so that data can travel across the network in either direction. Such closed-loop networks have the advantage that if the network cable breaks between stations, the network traffic can take the other path around the loop. On an open-ended network with two file servers, respectively supporting primary and secondary drives for continuous processing, the possibility exists of a cable break between workstations resulting in a split network, with one group of workstations accessing one file server, and the remainder accessing the other. In a preferred configuration, this problem is avoided by locating the file servers at an end of the network, side-by-side in data path terms. Physically locating a secondary file server at the end of a network, in a remote location, can provide advantages of protection against local disasters such as fire.

While being useful in most network environments, including those with only a small number of users, such as two or three, employing all types of data files, the invention is of particular advantage on networks having from several to several hundred users, for example from three to one thousand, using large files having separate read-write data categories for proper multi-user allocation, for example multi-megabyte database files, categorized into records numbering in the thousands or tens of thousands. Accounting files maintaining customer and inventory records are a widespread presence on a multi-user network, and may easily have a file size of tens or hundreds of megabytes.

The principles of the invention are applicable to substantially any network operating system and to substantially any workstation operating system that permits drive write requests to be intercepted and revectored to multiple drives in the manner of the parent invention.

Some examples of preferred network operating systems are, using trade marks belonging to the companies indicated, NETWARE (Novell, Inc.), WINDOWS NT (Microsoft Corp.), LANTASTIC (Artisoft, Inc.), LAN MANAGER (IBM Corp.), UNIX from various sources, OS/2 (IBM Corp.), TOPS (Sun Microsystems, Inc.), Vines (Banyan Corp.), DCA 10NET (Digital Communications Associates Inc.) and 3+ Share (3Com Corp.), as well as BTRIEVE (Novell, Inc.), ORACLE (Oracle Corp), GUPTA (Gupta corporation) and other relational database operating systems. Other systems capable of supporting a file server storage drive for multi-user access can be used, for example, mainframe systems such as VMS (Digital Equipment Corp.).

Although not essential, preferred embodiments of the network operating system are able to support DOS workstations, in the sense of allowing DOS workstations to access data stored on a logical drive on another computer on the network.

Preferred operating systems at the workstations are MS-DOS v.3.3 or higher, including MS-DOS 5.0 and 6.0, and equivalents of or DOS-compatible operating systems from IBM Corp. and others. Other operating systems that support DOS at the workstation are also preferred, for example, WINDOWS 3.1, WINDOWS NT and WINDOWS FOR WORKGROUPS (all Microsoft Corp.).

While DOS environments constitute currently preferred environments for the practice of this invention, the invention can be modified in its interfaces to port it to other workstation environments, for example, MACINTOSH (Apple Computer Corp.) or OS/2 or PICK (Richard Pick).

While an illustrative embodiment of the invention has been described above, it is, of course, understood that various modifications will be apparent to those of ordinary skill in the art. Such modifications are within the spirit and scope of the invention, which is limited and defined only by the appended claims.

We claim:

1. On-line, data-replication software operative on a computer network having multiple, intelligent processor-equipped workstations, said software being loadable to RAM at said workstations and replicating data-changing activity originating from said workstation to both a primary storage device supported by a primary file server and to a secondary storage device, said primary file server providing multi-user access to said primary storage device and supporting data-access locking with data-access lock and unlock capabilities for regulating multi-user access to data on the primary logical drive said data-replication software having an access-lock-sequencing protocol comprising:

a) an access lock sequencer operative to apply access locks sequentially, firstly to data on said primary storage device and subsequently to replicated data, on said secondary storage device; and b) an access-unlock sequencer operative to remove access locks sequentially, firstly, from access-locked data on said secondary storage device and subsequently from access-locked data on said primary storage device.

2. Data-replication software according to claim 1 comprising means to deny all users access to said secondary storage device while the primary storage device is operative.

3. Data-replication software according to claim 1 wherein said secondary storage device is supported by a secondary, or backup, file server which can take over processing in the event of failure of the primary and wherein said data-replication software includes a drive re-labeling routine to transfer processing initiated by a workstation from the failed primary to the secondary.

4. Data-replication software according to claim 1 comprising multiple secondary storage devices for additional levels of data redundancy, said access-lock sequencer being operative to apply access locks to each said secondary storage device in turn, in a specified, secondary, lock-applying sequence and said access-unlock sequencer can remove locks from said secondary storage devices in the same sequence.

5. A computer network operating system for a computer network having multiple, intelligent, data-manipulating workstations interconnected on said network for resource sharing, a primary logical drive and a secondary logical drive, said logical drives being accessible by said workstations for data transfer therebetween, said network operating system comprising a network shell loadable to each said intelligent workstation to provide said resource sharing, said network shell including a data-replication module to provide fault tolerance by continuously maintaining a functionally identical, duplicate data image on said secondary logical drive of data on said primary logical drive, said data-replication module comprising data-replication means to replicate all data-changing activity generated at each said workstation and addressed to said primary logical drive, to said secondary logical drive wherein, in operation, said network shell is loaded to, and operative at, each said workstation having data-changing access to said primary logical drive, whereby all individual data changes of said primary logical drive data effected at said workstations are replicated to said secondary logical drive thereby to maintain a functionally identical duplicate data image on said secondary logical drive of said primary logical drive data, in a continuous manner.

6. A network operating system according to claim 5 comprising means to couple access rights to said primary logical drive with said data-replication module whereby all workstations accessing said primary logical drive also replicate data to said secondary logical drive.

* * * * *